(12) United States Patent
Lin

(10) Patent No.: US 7,078,942 B2
(45) Date of Patent: Jul. 18, 2006

(54) DRIVING APPARATUS FOR GENERATING A DRIVING CURRENT USING PWM

(75) Inventor: Jyh Chain Lin, Tu-Chen (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 23 days.

(21) Appl. No.: 10/805,048

(22) Filed: Mar. 18, 2004

(65) Prior Publication Data

US 2005/0206413 A1    Sep. 22, 2005

(51) Int. Cl.
*H03K 3/00* (2006.01)

(52) U.S. Cl. .................. 327/108; 327/131; 327/165

(58) Field of Classification Search ............... 327/108, 327/109, 110, 143, 323; 326/82, 83
See application file for complete search history.

(56) References Cited

U.S. PATENT DOCUMENTS

| | | | | |
|---|---|---|---|---|
| 3,651,892 A | * | 3/1972 | Szabo et al. ............... 187/293 |
| 3,659,284 A | * | 4/1972 | Rusch .......................... 463/3 |
| 4,661,766 A | * | 4/1987 | Hoffman et al. ........... 323/287 |
| 4,764,856 A | * | 8/1988 | Rausch ................... 363/21.17 |
| 4,804,892 A | * | 2/1989 | Muller ....................... 318/254 |
| 5,416,361 A | * | 5/1995 | John et al. ................. 327/310 |
| 5,663,667 A | * | 9/1997 | Blum et al. ................ 327/134 |
| 5,703,473 A | * | 12/1997 | Phillips et al. ............. 323/282 |
| 5,777,503 A | * | 7/1998 | Faulk ......................... 327/323 |
| 5,804,943 A | * | 9/1998 | Kollman et al. ........... 320/167 |
| 6,744,291 B1 | * | 6/2004 | Payne et al. ............... 327/143 |
| 6,753,723 B1 | * | 6/2004 | Zhang ........................ 327/540 |
| 6,763,114 B1 | * | 7/2004 | Nalbant ...................... 381/120 |
| 6,813,173 B1 | * | 11/2004 | Lipcsei ........................ 363/98 |
| 6,897,640 B1 | * | 5/2005 | Nebon et al. .............. 323/282 |
| 6,920,054 B1 | * | 7/2005 | Florence et al. ............. 363/41 |
| 6,989,701 B1 | * | 1/2006 | Lin et al. .................... 327/175 |

* cited by examiner

*Primary Examiner*—Tuan T. Lam
*Assistant Examiner*—Hiep Nguyen
(74) *Attorney, Agent, or Firm*—Wei Te Chung

(57) ABSTRACT

A current driving apparatus includes a first square wave generator (100), a second square wave generator (200), an FET (Field Effect Transistor) (3), and a power supply (9). The first square wave generator has an output connected to the second square wave generator's input. The second square wave generator has an output connected to the FET gate. A current clamping resistor (11) is provided between the FET source and the power supply. The FET drain provides current to a possible load (not shown). The first square wave generator generates a low frequency square wave signal for timing control, and the second square wave generator generates a high frequency square wave signal for amplitude control.

7 Claims, 5 Drawing Sheets

DRIVING APPARATUS FOR GENERATING A DRIVING CURRENT USING PWM

BACKGROUND OF THE INVENTION

1. Field of the Invention

The present invention relates to a current driving apparatus, and particularly to a current driving apparatus using PWM (pulse width modulation.

2. Description of Related Art

Referring to FIG. 9, a driver circuit has a load comprising LEDs (light emitting diodes). A current clamping resistor 20 is provided between a power supply 10 and a light emitting diode (LED) array 30 formed in an m×n matrix of light emitting diodes 31. Voltage provided by the power supply 10 is designated U, resistance of the said current clamping resistor 20 is R, resistance of each light emitting diode is Rs, and current in the main path is I. The ohm's law for the driver circuit shown in FIG. 9 can be expressed by the equation:

$$U - m \times Von = I(R + Rs(m/n))$$

wherein Von is a threshold voltage of the light emitting diode 31.

Simplifying the above equation, we have:

$$U - Vx = I(R + Rx), \text{ wherein } Vx = m \times Von,\ Rx = Rs(m/n)$$

Because of the existence of Von, current I is not in direct proportion to U. For example, when U changes to 2U, current I does not double, but instead changes to less than 2I. Since I do not vary linearly with U, it is difficult to control the current I precisely.

Additionally, if timing control is required, the additional timing control circuit makes the whole circuit more complicated.

It is desirable to provide an improved current driving apparatus which overcomes the above problems.

SUMMARY OF THE INVENTION

An object of the present invention is to provide a current driving apparatus that provides precise current and timing control.

A current driving apparatus in accordance with the present invention comprises a first square wave generator, a second square wave generator, an FET (Field Effect Transistor) and, a power supply. The first square wave generator has an output connected to the second square wave generator's input. The second square wave generator has an output connected to the FET gate. A current clamping resistor is provided between the FET source and the power supply. The FET drain provides current to a possible load. The first square wave generator generates a low frequency square wave signal for timing control, and the second square wave generator generates a high frequency square wave signal for amplitude control.

An overall goal of the present invention is to provide a current driving apparatus having a low frequency square wave generator for timing control and a high frequency square wave generator for amplitude control.

Other objects, advantages, and novel features of the present invention will become more apparent from the following detailed description when taken in conjunction with the accompanying drawings; in which:

DETAILED DESCRIPTION OF THE INVENTION

Figure 1:
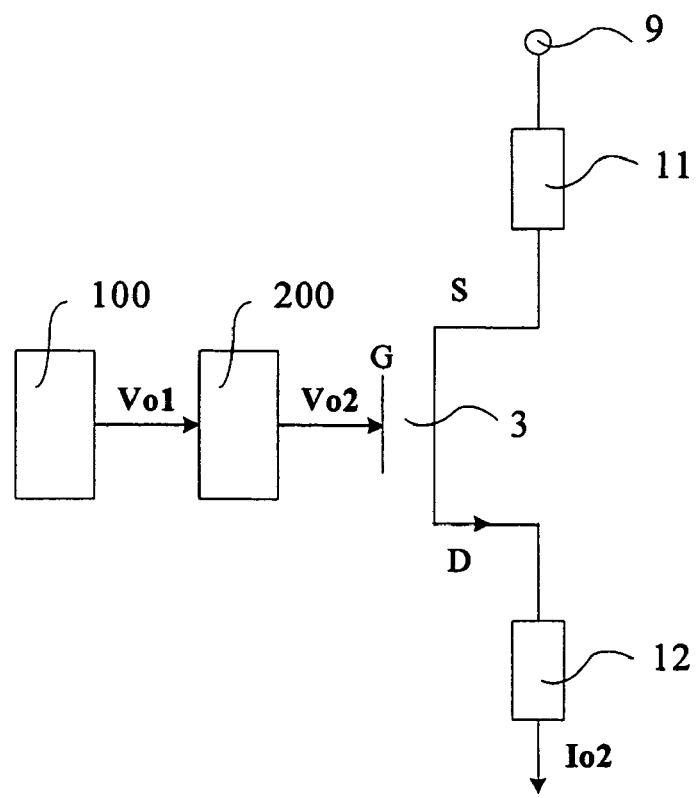
FIG. 1 is a schematic view of a current driving apparatus in accordance with the present invention.

Referring to FIG. 1, a current driving apparatus according to the present invention comprises a first square wave generator 100, a second square wave generator 200, an FET (Field Effect Transistor) 3, a power supply 9, a current clamping resistor 11, and a resistor 12. The first square wave generator 100 has an output terminal (not shown) connected to an input terminal (not shown) of the second square wave generator 200. The second square wave generator 200 has an output terminal (not shown) connected to the FET 3 gate. The current clamping resistor 11 is provided between the FET 3 source and the power supply 9. The resistor 12 is provided between the FET 3 drain and the possible load (not shown). A period of a low frequency square wave signal Vo1 generated by the first square wave generator 100 is 10 times that of a period of a high frequency square wave signal Vo2 generated by the second square wave generator 200. The FET 3 receives a voltage signal input and provides a current Io2 to the load.

Figure 2:
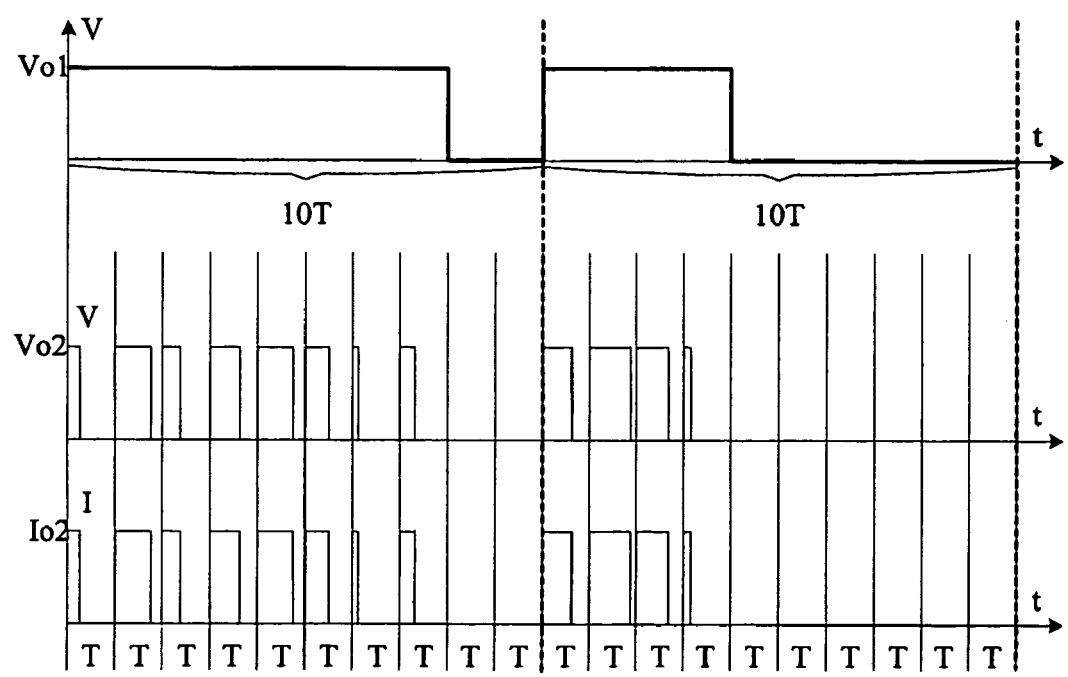
FIG. 2 is a signal timing diagram showing time vs. signal amplitude for three signals in the current driving apparatus in FIG. 1.

Referring to FIG. 2, a signal timing diagram shows the relationship time vs. signal amplitude in the current driving apparatus. The period of high frequency square wave Vo2 generated by the second square wave generator 200 is T, while the period of the low frequency square wave Vo1 generated by the first square wave generator 100 is 10T. In a 20T period of time, the signal Vo1 determines a switch state of the current Io2, i.e. when Vo1 is in a high state, the FET 3 is turned ON, allowing current Io2 to flow to the load; when Vo1 is in a low state, the FET 3 is turned OFF and current Io2 is prohibited from flowing to the load. Signal Vo2 determines not only the switch state but also the amplitude of the current Io2. The reason lies in this: when Vo1 is in a high state, Vo2 determines the ratio of ON time in every high frequency square wave signal period, i.e. the duty cycle of current signal Io2, which equals to different amplitude of the current Io2 in actual driving effect, and when Vo1 is in a low state, Vo2 changes to zero, and Io2 changes to zero, so there is no current drive signal flowing out.

The above factor of 10 frequency relationship between the low frequency wave and the high frequency wave is certainly adjustable in actual application. In fact, the frequency of each of the square wave signals may be adjusted to suit various requirements.

Figure 3:
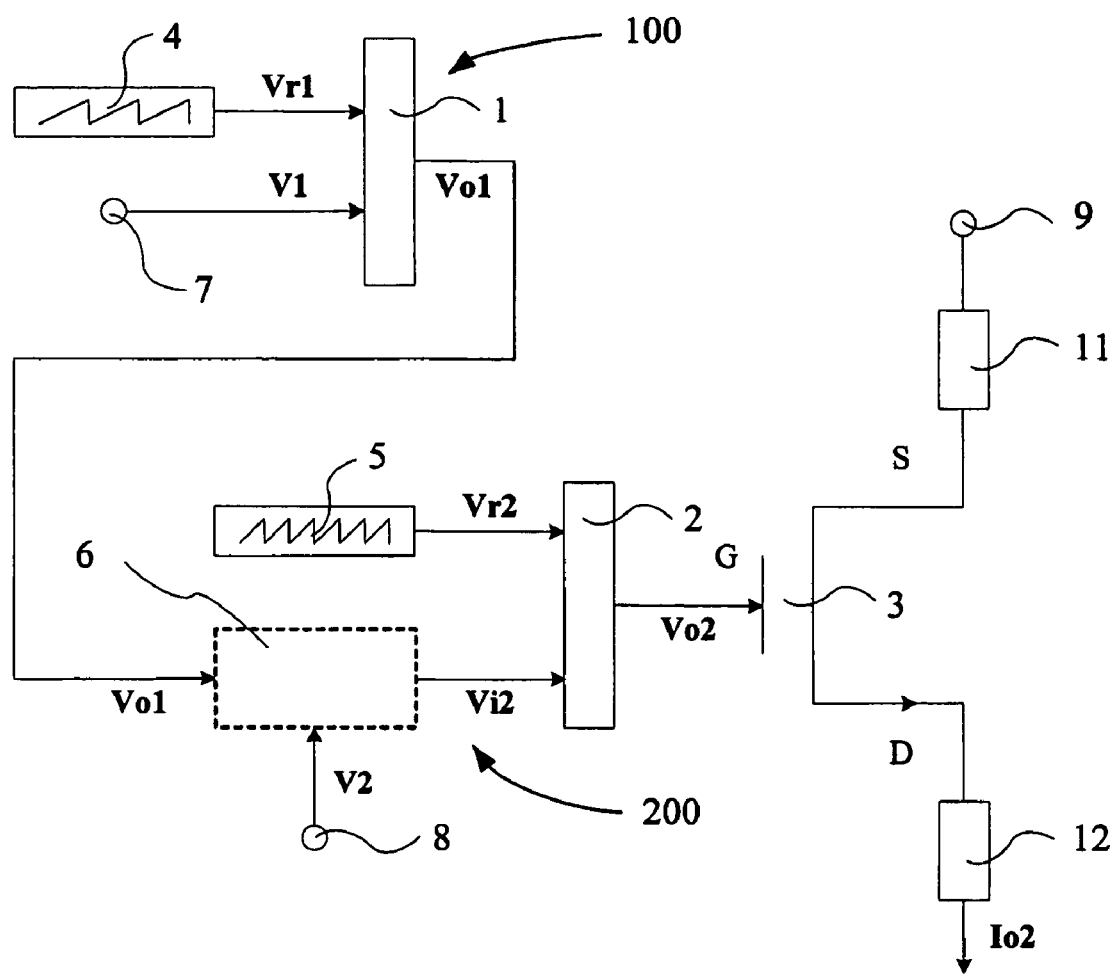
FIG. 3 is a more detailed schematic view of the current driving apparatus in FIG. 1.

Referring to FIG. 3, a more detailed schematic view of the current driving apparatus of FIG. 1 is shown. The current driving apparatus comprises the first square wave generator 100, the second square wave generator 200, the FET 3, the power supply 9, the current clamping resistor 11 and the resistor 12. The first square wave generator 100 comprises a first comparator 1, a low frequency sawtooth wave generator 4, and a timing control signal source 7. The second square wave generator 200 comprises a second comparator 2, a high frequency sawtooth wave generator 5, a variable amplifier 6, and an amplitude control signal source 8. The low frequency sawtooth wave generator 4 and the timing control signal source 7 are connected to two input ends (not label) of the first comparator 1. An output end (not labeled) of the first comparator 1 is connected to an input end (not labeled) of the variable amplifier 6. The amplitude control signal source 8 is connected to the other input end of the variable amplifier 6. Two output ends of the variable amplifier 6 and the high frequency sawtooth wave generator 5 are connected to two input ends of the second comparator 2. An output of the second comparator 2 is connected to the FET 3 gate. The current clamping resistor 11 is provided between the FET 3 source and a power supply 9. The resistor 12 is connected to the FET 3 drain.

Figure 4:
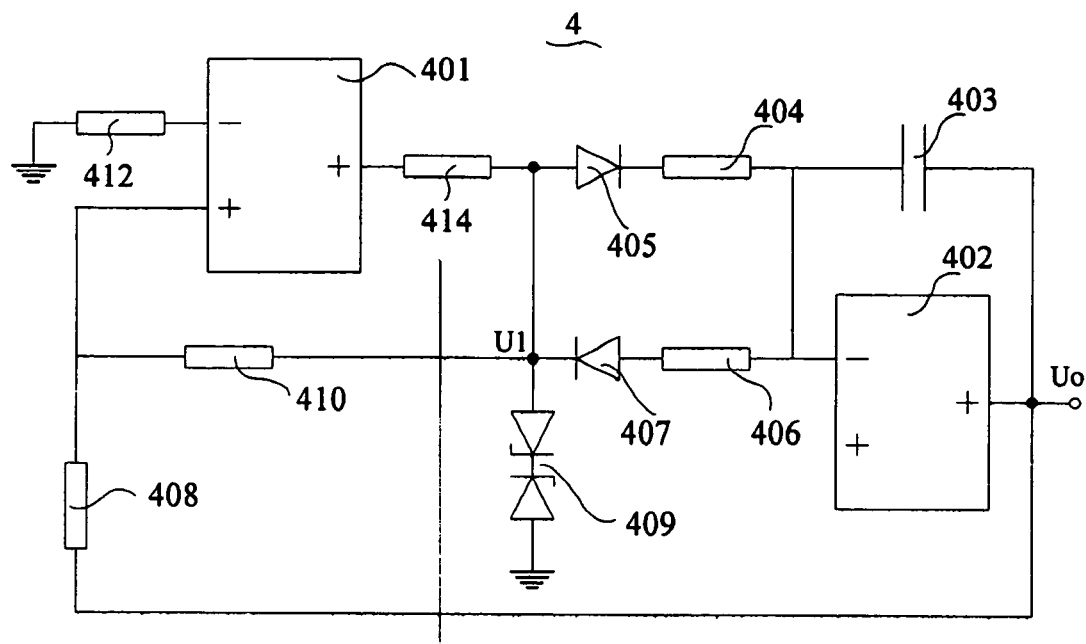
FIG. 4 is a diagram showing a circuit configuration for a low frequency sawtooth generator of FIG. 3.

Referring to FIG. 4, a circuit diagram of a circuit of a low frequency sawtooth wave generator 4 of FIG. 3 is shown. A negative input end of an operational amplifier 401 is connected through a resistor 412 to ground potential. Feedback resistors 408 and 410 are connected to a positive input end of the operational amplifier 401, which makes that the potential of the positive input end of the operational amplifier 401 is determined collectively by Uo and U1. The output of the operational amplifier 401 is connected to resistor 414. The operational amplifier 401, two feedback resistors 408, 410, and the two resistors 412, 414 compose a comparator. The negative input of operational amplifier 402 is connected to double-zener diodes 409 via two circuits, one consisting of resistor 404 and diode 405, the other consisting of resistor 406 and diode 407. This negative input is also connected to capacitor 403. The operational amplifier 402, the resistors 404 and 406, the diodes 405 and 407, the capacitor 403, and the double zener diodes 409 compose an integrator. By feeding back the signal Uo and the signal U1 to the operational amplifier 401, the output signal Uo of the operational amplifier 402 becomes a sawtooth waveform.

By changing the parameters of the resistors 404, 406, 408, 410 and the capacitor 403, the frequency of the output sawtooth wave signal can be changed. Thus, by changing parameter values of the above-described components, a same circuit layout of the low frequency sawtooth wave generator 4 can be used to generate a high frequency sawtooth wave signal.

Certainly, there are other ways to generate a sawtooth wave signal, either a high frequency one or a low frequency one. In the present invention, the sawtooth wave generators are not limited to the foregoing forms.

Figure 5:
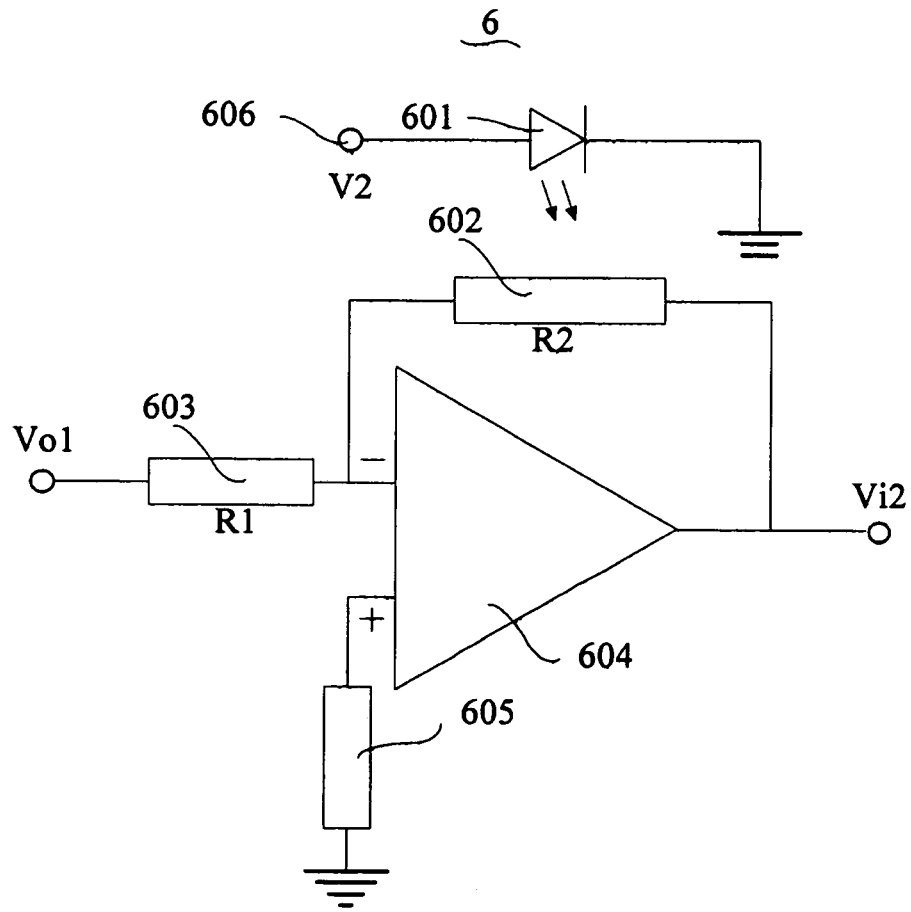
FIG. 5 is a diagram showing a circuit configuration for an variable amplifier of FIG. 3.

Referring to FIG. 5, a photosensitive resistor amplifier is used as the variable amplifier 6 in the present invention. The photosensitive resistor amplifier comprises an LED 601, a photosensitive resistor 602, an operational amplifier 604, a reference signal source 606, two resistors 603, 605. The LED 601 receives a reference signal V2 from the reference signal source 606 and illuminates the photosensitive resistor 602, which is connected between a negative input end and an output end of the operational amplifier 604. The resistor 603 connects the negative input end of the operational amplifier 604 to an input signal Vo1, and the other resistor 605 is connected between a positive input of the operational amplifier 604 between ground potential.

The amplitude control signal V2 can control an intensity of the illumination of the LED 601, which consequently influences the resistance of the photosensitive resistor 602. By choosing a suitable LED 601 and photosensitive resistor 602 combination, the resistance R2 of the photosensitive resistor 602 can be coupled in linear relation with the reference signal V2, which can be expressed in the following equation:

$R2=KV2$ (K is a constant).

The relation for the operational amplifier 604 is:

$Vi2=-(R2/R1)Vo1=M\ Vo1$ (M is amplification ratio),

From the foregoing equations, we can get the relation between Vi2 and Vo1:

$Vi2=-(K\ V2/R1)Vo1$, and the relation between M and V2:

$M=-(K/R1)V2$.

That is to say, the amplification ratio M of the photosensitive resistor amplifier 6 in magnitude is determined by reference signal V2, and furthermore, is proportional to reference signal V2.

Certainly, the variable amplifier 6 is not limited to the photosensitive resistor amplifier 6. Other kinds of variable amplifiers can instead be used, so long as the amplification ratio is in linear relation with the amplitude control signal V2.

Figure 6:
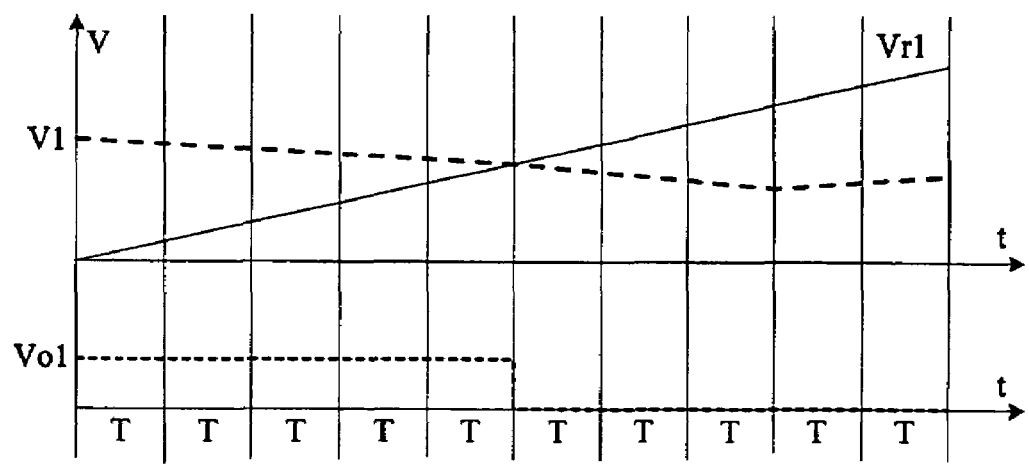
FIG. 6 is a signal timing diagram showing time vs. signal amplitude for three signals in a first comparator of FIG. 3.
Figure 7:
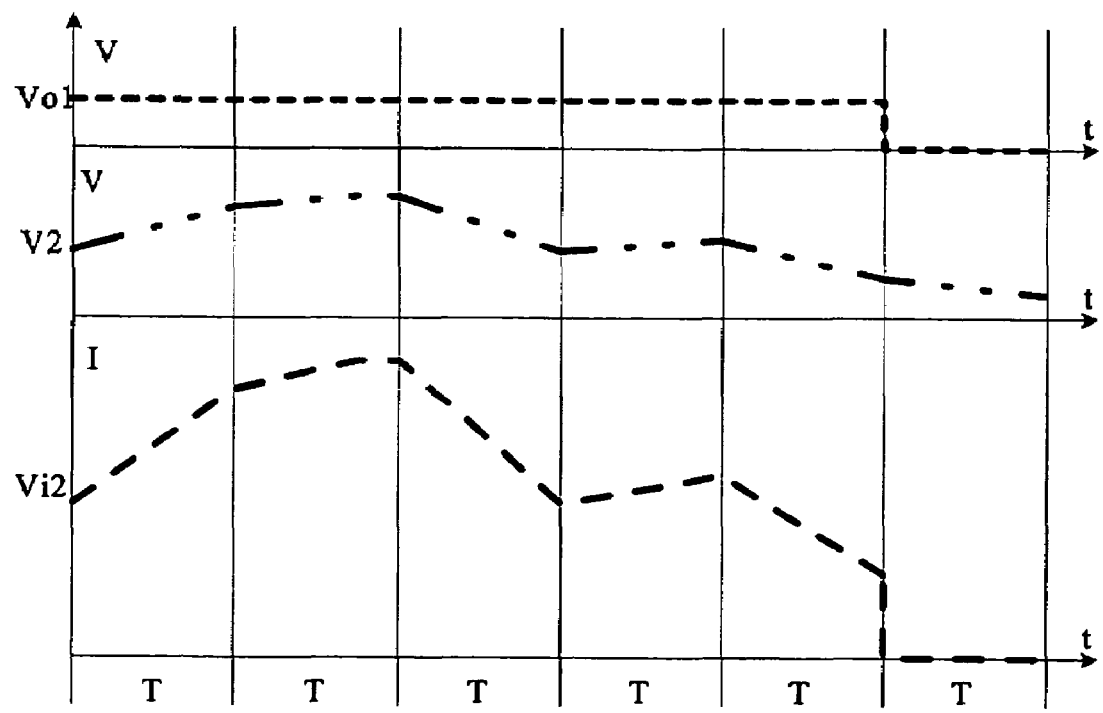
FIG. 7 is a signal timing diagram showing time vs. signal amplitude for three signals in the variable amplifier of FIG. 3.
Figure 8:
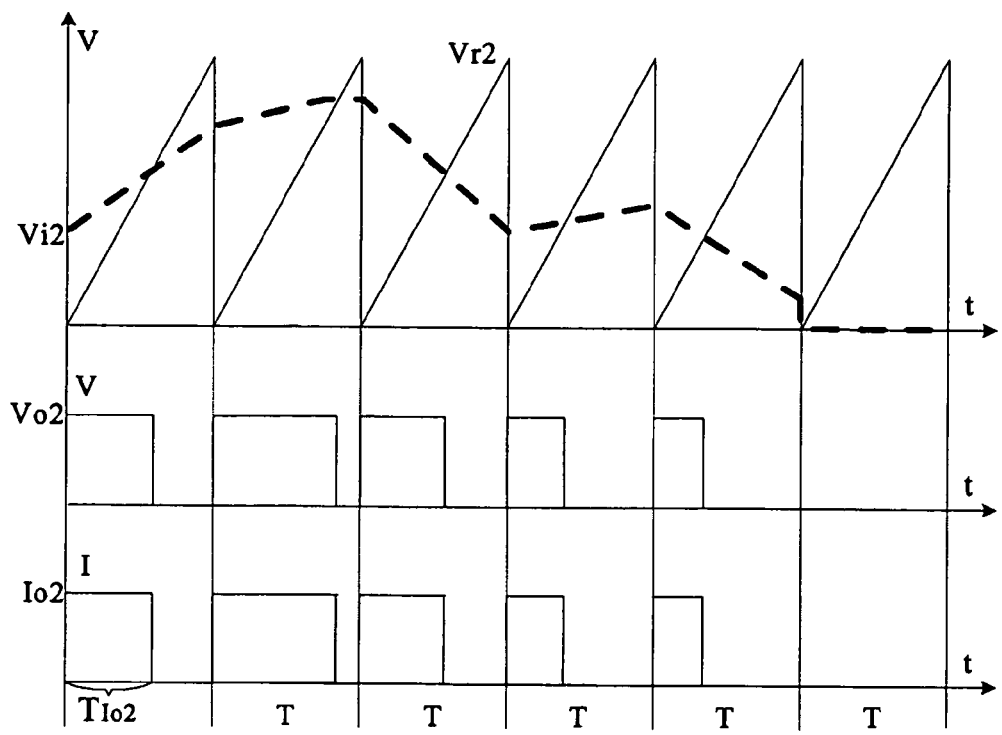
FIG 8 is a signal timing diagram showing time vs. signal amplitude for four signals in a second comparator and in an FET of FIG 3.
Figure 9:
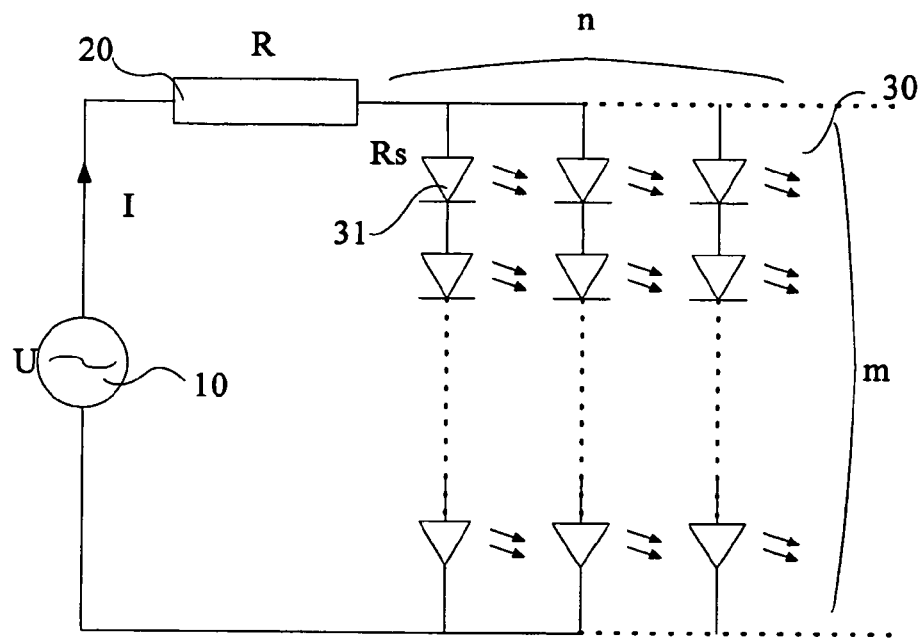
FIG. 9 is a schematic view of a conventional current driving apparatus.

Referring to FIG. 6, FIG. 7, and FIG. 8, signal timing diagrams show the relationship time vs. signal amplitudes for several signals in the current driving apparatus. The period of the high frequency sawtooth wave generated by the second square wave generator 200 is designated to be T, and the period of the low frequency sawtooth wave generated by the first square wave generator 100 is designated to be 10T.

Referring to FIG. 6, a diagram shows the relationship time vs. signal amplitudes for three signals in the first comparator 1. The timing control signal V1 generated by the timing control signal source 7 is a reference signal. Vr1 is a low frequency sawtooth wave signal. Vo1 is an output signal of the first comparator 1. The timing control signal V1 is compared with the low frequency sawtooth wave signal Vr1 in the first comparator 1. If the timing control signal V1 is greater than the instantaneous sawtooth wave signal Vr1, the output signal Vo1 is in a high state; otherwise, the output signal Vo1 is zero, in a low state. For V1 and Vr1 as in FIG. 6, the output signal Vo1 is in a high state in the first 5T period of time and is zero in the following 5T period of time. So the timing control signal V1 determines when the output signal is high and when it is turned off.

Referring to FIG. 7, a diagram shows the relationship time vs. signal amplitude for three signals in the variable amplifier 6. The output signal Vo1 from the first comparator 1 serves as an input signal to the variable amplifier 6. The amplitude control signal V2 generated by the amplitude control signal source 8 serves as a reference signal. Vi2 is an output signal, which will be inputted to the second comparator 2. The requirement that the amplification ratio M of the variable amplifier 6 be in linear relationship with amplitude control signal V2 results in a relation between Vi2 and V2 as expressed in the following formula:

$$Vi2 = M \times Vo1 = N \times V2 \times Vo1 = (N \times Vo1)\,V2,\ (N\text{ is a constant}).$$

When Vo1 is a certain value in the first 5T time period, the output signal Vi2 is in linear relationship with the amplitude control signal V2, and so, has a similar shape when graphed next to V2 as shown in FIG. 8. When Vo1 changes to zero, the amplifier 6 has no input signal to amplify, so its output Vi2 changes to zero.

Referring to FIG. 8, a diagram shows the relationship time vs. signal amplitude for four signals in the second comparator 2 and FET 3. Vi2 is an input signal of the second comparator 2. Vr2 is a high frequency sawtooth wave signal. Vo2 is an output signal of the second comparator 2 and is the input signal of the gate of the FET 3. Io2 is the current flowing from the drain of the FET 3. The input signal Vi2 is compared with the high frequency sawtooth wave signal Vr2 in the second comparator 2. If the input signal Vi2 is greater than the instantaneous sawtooth wave signal Vr2, the output signal Vo2 is in a high state, and the FET 3 provides current Io2; otherwise, the output signal Vo2 is zero, and no current is provided.

In one T time period of the high frequency sawtooth wave signal Vr2, the input signal Vi2 is considered to be constant. So the duty cycle of the current Io2 is in direct proportion to the amplitude of Vi2. According to the conclusion two paragraphs above, Vi2=(N Vo1) V2, (N is a constant), so we can state that the duty cycle of the current Io2 is in direct proportion to the amplitude control signal V2.

Referring to FIG. 3, the timing control voltage signal V1 generated by the timing control signal source 7 is compared with the low frequency sawtooth voltage signal Vr1 generated by the low frequency sawtooth wave generator 4 in the first comparator 1 to generate a first voltage output signal Vo1, which determines the timing of the final current. The first voltage output signal Vo1 is then magnified by the amplifier 6, whose amplification ratio is determined by the amplitude control signal V2 generated by the amplitude control signal source 8. The magnified voltage signal Vi2 is compared with the high frequency sawtooth wave signal Vr2 in the second comparator 2, which generates a second voltage output signal Vo2 that determines the duty cycle of the final current when there is current provided to the load. The FET 3 transforms the second voltage output signal Vo2 to current signal and provides the current through the resistor 12 to the load (not labeled).

But, it should be understood that the two square wave generators are not limited to the foregoing described designs. Other designs may be adopted so long as they accomplish the timing control and amplitude control of the current. The low frequency square wave generator must control timing. The high frequency square wave generator must control amplitude.

The load of the present invention could be LEDs, or CCFL(Cold Cathode Fluorescence Lamps).

The present invention, with its load, could be used in a display as a light source.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

The invention claimed is:

1. A driving apparatus for generating a drive current, comprising:
   a first square wave generator directed to accomplish timing control of the drive current, the first square wave generator comprising a first comparator, a low frequency sawtooth wave generator, and a timing control signal source, wherein the low frequency sawtooth wave generator is connected to one input of the first comparator, and the timing control signal source is connected to another input of the first comparator;
   a second square wave generator directed to accomplish amplitude control of the drive current, wherein the second square wave generator comprises a second comparator, a high frequency sawtooth wave generator, a variable amplifier, and an amplitude control signal source, and wherein one input of the variable amplifier is connected to the output of the first square wave generator, another input of the variable amplifier is connected to the amplitude control signal source, an output of the variable amplifier is connected to one input of the second comparator, and the high frequency sawtooth wave generator is connected to another input of the second comparator;
   a field effect transistor; and
   a power source;
   wherein an output of the second square wave generator is connected to a gate of the field effect transistor, a current clamping resistor is provided between a source of the field effect transistor and the power supply, and a drain of the field effect transistor generates the device current to drive a desired load.

2. The driving apparatus according to claim 1, wherein the variable amplifier is a photosensitive resistor amplifier.

3. The driving apparatus according to claim 2, wherein the photosensitive resistor amplifier comprises a light emitting diode, a photosensitive resistor, an operational amplifier, a reference signal source, and a pair of resistors, the light emitting diode is connected to the reference signal source and illuminates the photosensitive resistor, which is connected between a negative input and an output of the operational amplifier, one of the resistors is connected between the negative input of the operational amplifier and an input signal source, and the other resistor couples a positive input of the operational amplifier and ground.

4. A driving apparatus comprising:
   a first square wave generator directed to accomplish timing control of a drive current, the first square wave generator comprising a first comparator, a low frequency sawtooth wave generator, and a timing control signal source, wherein the low frequency sawtooth wave generator is connected to one input of the first comparator, and the timing control signal source is connected to another input of the first comparator;
   a second square wave generator directed to accomplish amplitude control of the drive current, wherein the second square wave generator comprises a second comparator, a high frequency sawtooth wave generator, a variable amplifier, and an amplitude control signal source, and wherein one input of the variable amplifier is connected to the output of the first square wave generator, another input of the variable amplifier is connected to the amplitude control signal source, an output of the variable amplifier is connected to one input of the second comparator, and the high frequency sawtooth wave generator is connected to another input of the second comparator;
a field effect transistor; and
a power source;
wherein an output of the second square wave generator is connected to a gate electrode of the field effect transistor, the power source is connected to a source electrode of the field effect transistor, and a drain electrode of the field effect transistor generates a variable drive current.

5. A driving apparatus for generating a drive current, comprising:
a first square wave generator directed to accomplish timing control of the drive current;
a second square wave generator directed to accomplish amplitude control of the drive current, wherein the second square wave generator comprises a second comparator, a high frequency sawtooth wave generator, a variable amplifier, and an amplitude control signal source, one input of the variable amplifier is connected to an output of the first square wave generator, another input of the variable amplifier is connected to the amplitude control signal source, an output of the variable amplifier is connected to one input of the second comparator, and the high frequency sawtooth wave generator is connected to another input of the second comparator;
a field effect transistor; and
a power source;
wherein an output of the second square wave generator is connected to a gate of the field effect transistor, the power source is connected to a source of the field effect transistor, and a drain of the field effect transistor generates the drive current to drive a desired load.

6. The driving apparatus according to claim 5, wherein the variable amplifier is a photosensitive resistor amplifier.

7. The driving apparatus according to claim 6, wherein the photosensitive resistor amplifier comprises a light emitting diode, a photosensitive resistor, an operational amplifier, a reference signal source, and a pair of resistors, the light emitting diode is connected to the reference signal source and illuminates the photosensitive resistor, which is connected between a negative input and an output of the operational amplifier, one of the resistors is connected between the negative input of the operational amplifier and an input signal, and the other resistor couples a positive input of the operational amplifier and ground.

* * * * *